United States Patent [19]
Pickering et al.

[11] Patent Number: 5,691,667
[45] Date of Patent: Nov. 25, 1997

[54] RF RADIATION ABSORBING MATERIAL DISPOSED BETWEEN THE CATHODE AND ANODE OF AN ELECTRON BEAM TUBE

[75] Inventors: Alan Hugh Pickering; Geoffrey John Rowlands; Roy Heppinstall; Edward Stanley Sobieradzki; Geoffrey Thomas Clayworth, all of Essex, Great Britain

[73] Assignee: English Electric Valve Co., Ltd., Essex, Great Britain

[21] Appl. No.: 211,030

[22] PCT Filed: Sep. 14, 1992

[86] PCT No.: PCT/GB92/01684

§ 371 Date: May 17, 1994

§ 102(e) Date: May 17, 1994

[87] PCT Pub. No.: WO93/06632

PCT Pub. Date: Jan. 4, 1993

[30] Foreign Application Priority Data

Sep. 18, 1991 [GB] United Kingdom .................... 9119947

[51] Int. Cl.$^6$ ................ H01J 23/54; H03F 3/54
[52] U.S. Cl. ................ 330/44; 330/45; 315/5.33; 315/5.37; 315/5.39; 315/5; 333/81 R
[58] Field of Search .................. 315/4, 5, 5.33, 315/5.37, 5.39, 39; 330/44, 45; 333/81 R, 251

[56] References Cited

U.S. PATENT DOCUMENTS 2,923,689  2/1960  Saltzman et al. ............... 333/81 R X
3,482,419  12/1969  Luebke ....................... 315/5.39 X
4,146,854  3/1979  Ishino et al. ................. 333/81 R
4,494,039  1/1985  Kim .......................... 315/3 X
4,529,911  7/1985  Hutter ....................... 333/251 X

FOREIGN PATENT DOCUMENTS 4107552   9/1991  Germany .
54-093301  7/1979  Japan .
54-124298  9/1979  Japan .
55-036987  3/1980  Japan .
2004871   1/1990  Japan .

OTHER PUBLICATIONS

"Submillimeter and Millimeter Wave Characterization of Absorbing Materials", Hamid Hemmati, John C. Mather and William L. Eichhorn; *Applied Optics*, 15 Dec. 1985, vol. 24, No. 24, pp. 4489–4492.

Patent Abstracts of Japan, vol. 10, No. 201 (E–419), Mar. 5, 1986 (JP A 61–045537).

Patent Abstracts of Japan, vol. 10, No. 192 (E–417), Feb. 25, 1986 (JP A 61–039435).

"The Characteristics of Electromagnetic Wave Absorber composed of Rubber, Carbon and Ferrite", by Mirtaheri et al, Transactions of the Institute of Electronics, Information and Communicaiton Engineers of Japan, vol. 72, No. 12, Dec. 1989, Tokyo, Japan, pp. 1447–1451.

*Primary Examiner*—Benny T. Lee
*Attorney, Agent, or Firm*—Donald C. Casey, Esq.

[57] ABSTRACT

An r.f. radiation absorbing material able to hold off a 30 to 40 kV voltage difference is described as formed by a silicon rubber loaded with ferrite particles. The material is used to reduce self-oscillation in amplifiers.

17 Claims, 2 Drawing Sheets

5,691,667

RF RADIATION ABSORBING MATERIAL DISPOSED BETWEEN THE CATHODE AND ANODE OF AN ELECTRON BEAM TUBE

FIELD OF THE INVENTION

This invention relates to a radiation absorbing material and the use of this material to stop self oscillation in an amplifier, and particularly in an inductive output tube amplifier.

DESCRIPTION OF THE PRIOR ART

An inductive output tube amplifier, hereafter referred to as an IOT, is shown schematically in FIG. 1. This comprises a cathode 1 and an anode 2 separated by a grid 3, the anode 2 having a hole 2A passing through it.

In use, a high DC voltage, typically of the order of 30 to 40 KV is established between the cathode 1 and anode 2 and an RF input signal is applied between the cathode 1 and grid 3. The cathode 1, anode 2 and grid 3 are symmetrically arranged about an axis 6. Electrons are emitted by the cathode 1 and their movement towards the anode 2 is controlled by the relative voltages of the cathode 1 and the grid 3. Thus an electron beam coaxial with the axis 6 and modulated by the RF signal applied between the cathode 1 and the grid 3 is generated between the cathode 1 and the anode 2, most of the electrons in this modulated electron beam, often referred to as a bunched electron beam, pass through the hole 2A in the anode 2. This electron beam is then used to drive later stages in the amplifier.

The cathode 1 is linked to the grid 3 by a first resonant tuned circuit 4 while the anode 2 is linked to the grid 3 by a second resonant tuned circuit 5. As is conventional the tuned circuits 4 and 5 are each represented by an inductance and a capacitance in parallel in FIG. 1 although they will generally be far more complex than this in practice.

The first resonant tuned circuit includes variable components arranged so that by altering the value of the variable components its resonant frequency can be adjusted to the desired output frequency of the amplifier, the signal to be amplified is then coupled into this first resonant tuned circuit in order to apply it between the cathode 1 and the grid 3.

The second resonant tuned circuit 5 on the other hand is formed by the component parts of the amplifier and as a result resonates at a fixed frequency. RF baffles are provided to prevent interference between the first and second resonant tuned circuits 4 and 5 but it has been found that it is still possible under some conditions for RF radiation emitted by the second resonant tuned circuit 5 formed between the anode 2 and grid 3 to pass through the baffles and be picked up by the first resonant tuned circuit 4. This results in an RF voltage at the resonating frequency of the second resonant tuned circuit appearing between the cathode 1 and grid 3 causing the electron beam to be modulated at this frequency. This is self oscillation and the unwanted signal at the resonant frequency of the second tuned circuit 5 interferes with the signal it is desired to amplify and can generate high enough voltages to damage or disable the amplifier.

Self oscillation is generally a greater problem at higher operating frequencies and is often the limiting factor setting the maximum operating frequency of an IOT amplifier.

SUMMARY OF THE INVENTION

One way of reducing this problem would be to use an RF radiation absorbing material between the two resonant tuned circuits, but it was found that to achieve the best results such a material had to absorb RF radiation and be able to hold off the DC voltage between the anode and cathode.

This invention was intended to produce such a material and a method of using it to reduce self oscillation in an amplifier.

This invention provides an RF radiation absorbing material used to hold off a DC voltage difference and comprising a silicone rubber loaded with ferrite particles.

This material has been used in the past as a RF radiation absorber but it has now been realised that it can also be used to hold off a very high DC voltage, on the order of 30–40 KV.

In a second aspect this invention provides an amplifier including a cathode and an anode separated by a grid and enclosed within a ceramic envelope, where the ceramic envelope is surrounded by a layer of a silicon rubber loaded with ferrite particles.

An amplifier embodying the invention will now be described by way of example only with reference to the accompanying diagrammatic figures wherein like parts are identified by the same reference numbers between said figures, and in which,

BRIEF DESCRIPTION OF THE DRAWINGS

FIG. 3 is a schematic illustration in simplified form of the IOT of which FIG. 2 shows a part.

DETAILED DESCRIPTION OF THE INVENTION

Figure 1:
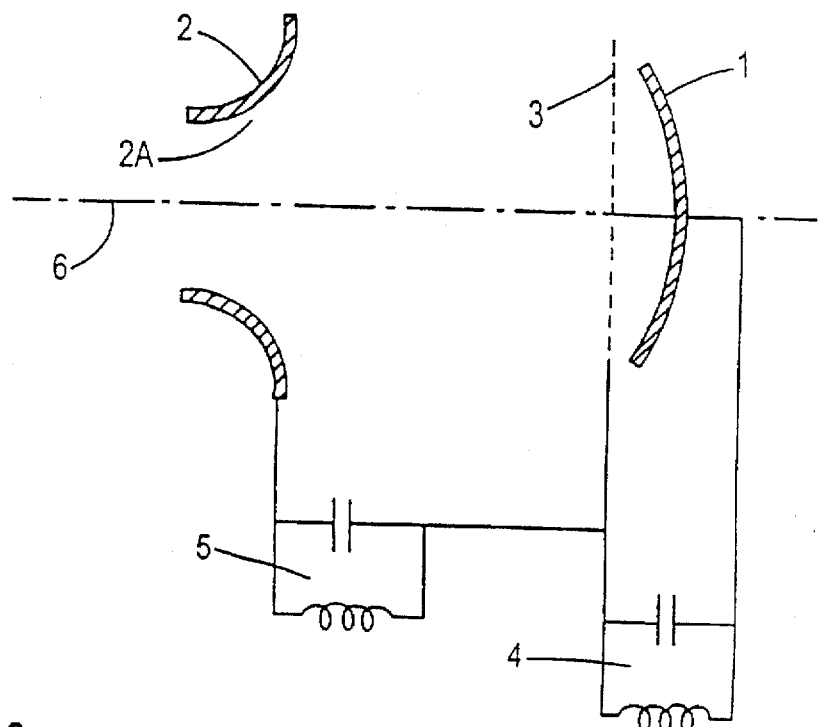
FIG. 1 shows a part of an amplifier.
Figure 2:
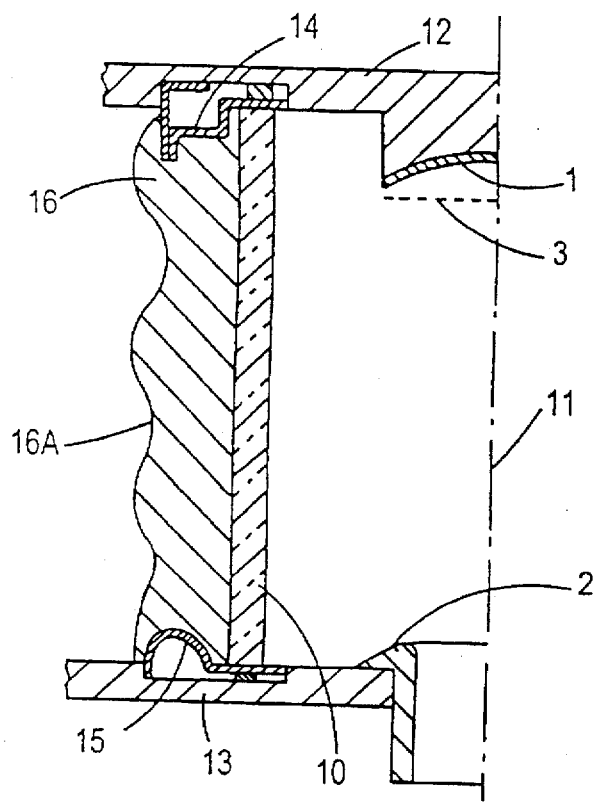
FIG. 2 shows a cross section through an amplifier employing the invention, similar parts having the same reference numerals throughout.

Referring to FIG. 2 the IOT amplifier structure shown in FIG. 1, comprising a cathode 1, anode 2 and grid 3 is enclosed within a tubular ceramic envelope 10. Only half of the structure is shown, it is rotationally symmetrical about the axis 11. The supports and feeds for the grid 3 are omitted for clarity, as is the cathode heater.

The ends of the cylindrical ceramic envelope 10 are closed by two conductive metal plates 12 and 13 and the interior of the envelope 10 is evacuated. A gas tight seal between the plates 12 and 13 and envelope 10 is provided by brazed conductive flanges 14 and 15 respectively.

The plate 12 is at the same voltage as the cathode 1 while the plate 13 is at the same voltage as the anode 2, as a result when the amplifier is operating, a voltage difference of 30 to 40 KV exists between the plates 12 and 13 and also between their associated flanges 14 and 15 respectively.

It has been realised that the RF radiation from the second tuned resonant circuit 5 which induces self oscillation escapes the enclosure formed by the plates 12 and 13 and ceramic 10 by passing through the ceramic envelope 10.

It was decided that the best way to reduce this escape of RF radiation and so reduce the tendency to self oscillation would be to surround the ceramic envelope with a lossy material, however such a layer would have to contact the flanges 14 and 15 and so would have to hold off a 30 to 40 KV DC voltage. No material was known to have the necessary properties to do this.

The escape of RF radiation is reduced by surrounding the cylindrical ceramic envelope 10 in a substantially cylindrical layer 16 of a silicon rubber loaded with ferrite particles.

A suitable ferrite loaded silicone rubber material is Eccosorb CF-S-4180 sold by Emerson and Cuming. This ferrite loaded silicon rubber material is a high loss material in the UHF and microwave ranges and it has been realised that it can also hold off very high DC voltages of the order of several tens of kilovolts.

The layer 16 is only substantially cylindrical because its outer surface 16A bears a series of smooth ripples or undulations which extend around the circumference of the layer 16. Those ripples prevent dust deposition forming tracks across the outer surface 16A of the layer 16. Such dust tracks would be undesirable because they could provide a path for arcing across the surface 16A.

Although the amplifier section shown has been described as a part of an IOT amplifier similar structures are used as parts of other amplifier types such as klystrons and the invention is equally applicable to such amplifiers.

Figure 3:
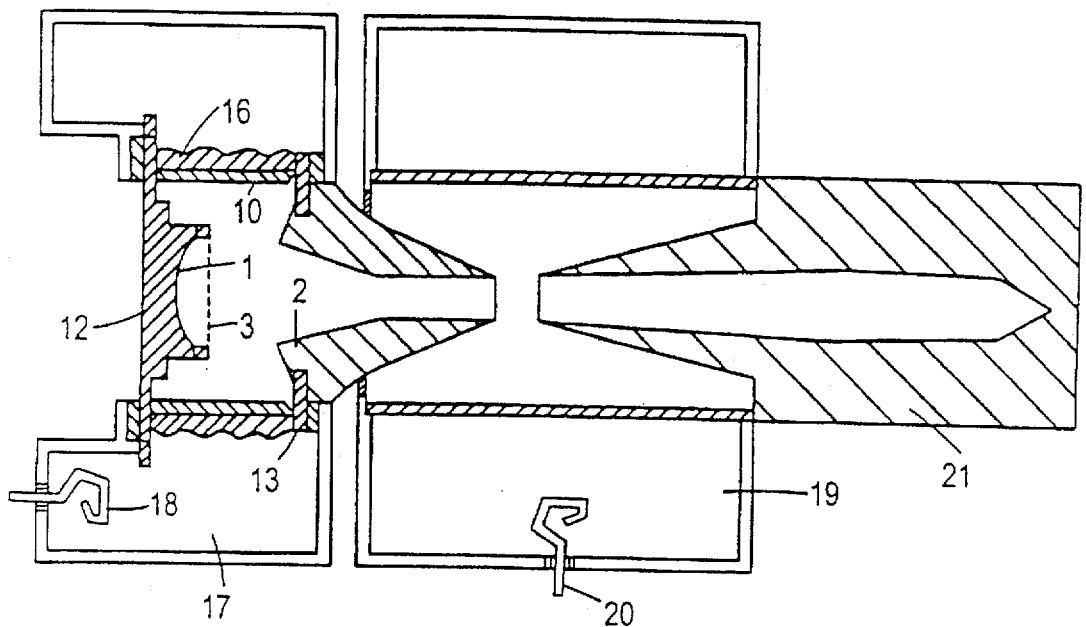

For example, FIG. 3 illustrates in simplified form an IOT which includes the embodiment of FIG. 2 as a part. A high frequency resonant input cavity 17 surrounds the electron gun assembly and includes coupling means 18 for applying a high frequency signal to be amplified to the IOT to produce a modulated electron beam. The modulated beam is transmitted via an output cavity 19 including a coupling loop 20 for extracting the amplified high frequency signal. A collector 21 is arranged to receive the electron beam.

Figure 4:
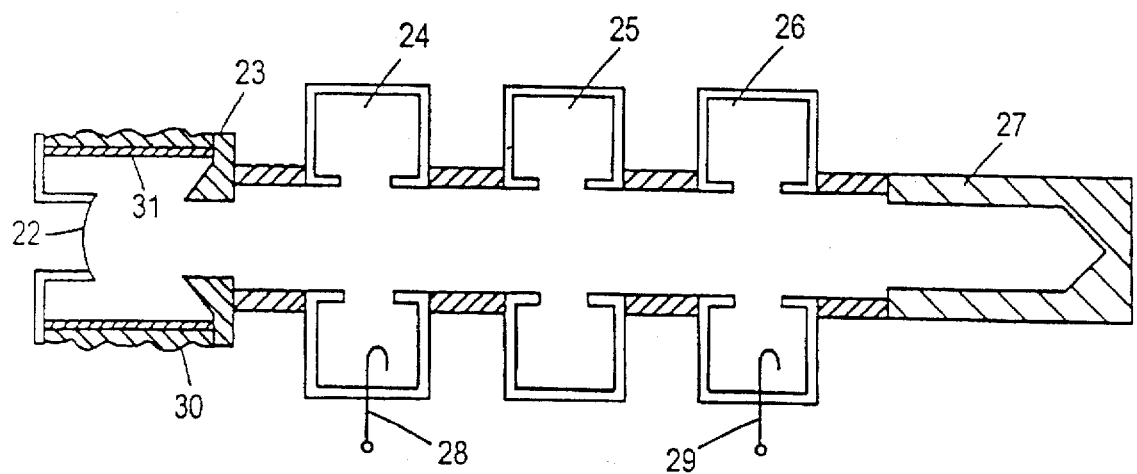
FIG. 4 is the schematic illustration of a klystron embodying this invention.

A klystron, which embodies this invention, is illustrated in FIG. 4 and includes a cathode 22, anode 23, and a plurality of resonant cavities 24, 25 and 26 along the electron beam path. A collector 27 receives the electron beam after transmission through the klystron. A coupling loop 28 enables a high frequency signal to be applied to the klystron to modulate the electron beam produced by the cathode 22. After amplification, the amplified signal is extracted from the klystron at coupling loop 29. Ferrite loaded silicon rubber 30 surrounds a ceramic cylinder 31 located between the cathode 22 and the anode 23.

Instead of the circumferential ripples described the outer surface could have any other of the many known dust deposition reducing profiles or if dust deposition was not a problem in a particular application, could be a simple cylindrical surface.

It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definition contained in the appended claims and equivalents thereof.

We claim:

1. A klystron comprising: an electron gun for generating an electron beam along an electron beam path, said electron gun comprising a cathode and an anode; an r.f. radiation absorbing material comprising a mixture of silicone rubber and ferrite particles surrounding said electron beam path between said cathode and said anode and arranged to provide electrical insulation between first and second parts of said klystron, said first part including said cathode and said second part including said anode, said first and second parts being at different voltages when in use; means coupled to said klystron for applying a high frequency signal to be amplified thereto; means coupled to said klystron for modulating said electron beam with said signal to produce an amplified signal; and means coupled to said klystron for extracting said amplified signal therefrom.

2. A klystron as claimed in claim 1 and including a ceramic envelope, said envelope enclosing said cathode and said anode and being surrounded by a layer of said material.

3. A klystron as claimed in claim 1 wherein said material is arranged to provide electrical insulation between said first part of said tube maintained at substantially cathode potential and said second part of said tube maintained at substantially anode potential in use.

4. An inductive output tube amplifier comprising: an electron gun for generating an electron beam along an electron beam path, said electron gun comprising a cathode, an anode and a grid located therebetween; an r.f. radiation absorbing material comprising a mixture of silicone rubber and ferrite particles surrounding said electron beam path between said cathode and said anode and arranged to provide electrical insulation between first and second parts of said tube, said first part including said cathode and said second part including said anode, said first and second parts being at different voltages when in use; means coupled to said amplifier for applying a high frequency signal to be amplified thereto; means coupled to said amplifier for modulating said electron beam with said signal to produce an amplified signal; and means coupled to said amplifier for extracting said amplified signal therefrom.

5. An amplifier as claimed in claim 4 wherein said material is arranged to provide electrical insulation between said first part of said tube maintained at substantially cathode potential and said second part of said tube maintained at substantially anode potential when in use.

6. An amplifier as claimed in claim 4 and including a ceramic envelope, said envelope enclosing said cathode and said anode and being surrounded by a layer of said material.

7. An electron beam tube comprising: an electron gun for generating an electron beam along an electron beam path, said electron gun comprising a cathode and an anode; and an r.f. radiation absorbing material comprising a mixture of silicone rubber and ferrite particles, said material surrounding said electron beam path between said cathode and said anode and arranged to provide electrical insulation between first and second parts of said tube, said first part including said cathode and the second part including said anode said first and second parts being at different voltages when in use.

8. A tube as claimed in claim 7 and including a ceramic envelope, said envelope enclosing said cathode and said anode and being surrounded by a layer of said material.

9. A tube as claimed in claim 7 wherein said material is arranged to hold-off a d.c. voltage difference in the range of 30 kV to 40 kV.

10. A tube as claimed in claim 7 wherein said material is arranged to provide electrical insulation between said first part of said tube maintained at substantially cathode potential and said second part of said tube maintained at substantially anode potential when in use.

11. A tube as claimed in claim 10 wherein said first part includes a cathode support supporting said cathode and said second part includes an anode support supporting said anode.

12. A tube as claimed in claim 7 wherein said electron gun includes a grid located between said cathode and said anode.

13. A tube as claimed in claim 12 and including a ceramic envelope, said envelope enclosing said cathode and said anode and being surrounded by a layer of said material.

14. A tube as claimed in claim 12 wherein said material is arranged to provide electrical insulation between said first part of said tube including said grid, maintained at substantially cathode potential and said second part of said tube maintained at substantially anode potential when in use.

15. An electron beam tube amplifying arrangement comprising: an electron gun for generating an electron beam along an electron beam path, said electron gun comprising a cathode and an anode; an r.f. radiation absorbing material comprising a mixture of silicone rubber and ferrite particles surrounding said electron beam path between said cathode and said anode and arranged to provide electrical insulation between first and second parts of said tube, said first part including said anode and said second part including said cathode, said first and second parts being at different voltages when in use; means coupled to said tube for applying a high frequency signal to be amplified thereto; means coupled to said tube for modulating said electron beam with said signal to produce an amplified signal; and means coupled to said tube for extracting said amplified signal from said arrangement.

16. An arrangement as claimed in claim 15 and including a ceramic envelope, said envelope enclosing said cathode and said anode and being surrounded by a layer of said material.

17. An arrangement as claimed in claim 15 wherein said material is arranged to provide electrical insulation between said first part of said tube maintained at substantially cathode potential and said second part of said tube maintained at substantially anode potential when in use.

* * * * *